United States Patent
Hallak

(10) Patent No.: US 7,911,264 B2
(45) Date of Patent: Mar. 22, 2011

(54) METHOD FOR RECONSTRUCTING A NOISE-REDUCED PERIODIC VOLTAGE SIGNAL

(75) Inventor: Jalal Hallak, Vienna (AT)

(73) Assignee: Siemens AG Österreich, Vienna (AT)

( * ) Notice: Subject to any disclaimer, the term of this patent is extended or adjusted under 35 U.S.C. 154(b) by 0 days.

(21) Appl. No.: 12/531,949

(22) PCT Filed: Jan. 22, 2008

(86) PCT No.: PCT/EP2008/050684
§ 371 (c)(1),
(2), (4) Date: Sep. 18, 2009

(87) PCT Pub. No.: WO2008/113620
PCT Pub. Date: Sep. 25, 2008

(65) Prior Publication Data
US 2010/0033238 A1    Feb. 11, 2010

(30) Foreign Application Priority Data
Mar. 21, 2007   (AT) .................................. A 441/2007

(51) Int. Cl.
*H03K 5/00* (2006.01)
(52) U.S. Cl. ........................................ 327/552; 327/557
(58) Field of Classification Search ................. 327/551, 327/552, 557
See application file for complete search history.

(56) References Cited

U.S. PATENT DOCUMENTS

| | | | |
|---|---|---|---|
| 4,872,127 A | 10/1989 | Nolan | |
| 5,237,492 A | 8/1993 | King | |
| 5,311,087 A * | 5/1994 | Suganuma | 327/94 |
| 5,606,280 A * | 2/1997 | Sohn | 327/553 |
| 5,694,077 A * | 12/1997 | Fuller | 327/552 |
| 7,652,526 B2 * | 1/2010 | Welles et al. | 327/554 |

FOREIGN PATENT DOCUMENTS

| | | |
|---|---|---|
| DE | 2902680 A1 | 8/1979 |
| DE | 3029249 A1 | 2/1982 |
| DE | 10 2005 024 624 B3 | 11/2006 |
| EP | 1 047 191 A1 | 10/2000 |
| JP | 10201079 A | 7/1998 |

OTHER PUBLICATIONS

Tedeschi, E. et al., "Repetitive Ripple Estimation in Multi-sampling Digitally Controlled dc-dc Converters", 32nd Annual Conference on IEEE Industrial Electronics, Nov. 2006, pp. 1685-1690. Abstract.

* cited by examiner

*Primary Examiner* — Hai L Nguyen

(57) ABSTRACT

A method of reconstruction of a fault-reduced voltage signal corresponding in frequency, amplitude and phase position to a sinusoidal input voltage fault-prone in frequency, amplitude and/or phase position is provided. The input voltage is fed to a first band-pass filter including an adjustable resonant frequency and amplification, the output voltage being the fault-reduced voltage signal. A controlled variable is determined for a first controller by determining the scanned differential voltage of the output voltage and the input voltage in zero points of the output voltage, the controller adjusting the resonate frequency of the first band-pass filter such that the differential voltage in the zero points disappears. A controlled variable is determined for a second controller by determining the scanned differential voltage of the output voltage and the input voltage in vertexes of the output voltage, the second controller controlling the amplification of the first band-pass filter such that the differential voltage in the vertexes disappears.

6 Claims, 9 Drawing Sheets

METHOD FOR RECONSTRUCTING A NOISE-REDUCED PERIODIC VOLTAGE SIGNAL

CROSS REFERENCE TO RELATED APPLICATIONS

This application is the US National Stage of International Application No. PCT/EP2008/050684 filed Jan. 22, 2008, and claims the benefit thereof. The International Application claims the benefits of Austrian Application No. A441/2007 AT filed Mar. 21, 2007; both of the applications are incorporated by reference herein in their entirety.

FIELD OF INVENTION

The invention relates to a method for reconstructing a noise-reduced periodic voltage signal corresponding in frequency, amplitude and/or phase to a sinusoidal input voltage affected by frequency, amplitude and phase noise, it being assumed that the input voltage consists of a sinusoidal fundamental component and superimposed disturbances in the frequency, amplitude and phase of the fundamental component. Such a method is used, for example, when a circuit arrangement is to be operated in synchronism with a sinusoidal input voltage, where the focus is mainly on the zero crossings of the sinusoidal input voltage. A possible field of application is, for example, in alternative power generation systems such as fuel cell stacks, photovoltaic installations, or wind power plants in which line commutated converters of all kinds, e.g. inverters, must be operated compatibly with a power supplier's AC grid.

BACKGROUND OF INVENTION

In applications of this kind, one is generally confronted with noise-affected input voltages. For example, line voltages of the above mentioned AC grids are subject to frequency, amplitude and/or phase noise, as well as harmonics. If the zero crossings of the input voltage, i.e. in this case the grid voltage, are now used e.g. for operating a circuit arrangement in synchronism with the grid voltage, due to superimposed harmonics, for example, zero crossings which do not correspond to those of the fundamental component may be detected, possibly resulting in defective operation of the grid-synchronous circuit arrangement which may eventually cause spurious shutdowns of the grid-synchronous circuit.

Conventionally, high-frequency input voltage noise such as harmonics, for example, is eliminated by low pass filters. However, low pass filters produce a phase shift in the low pass filter's output voltage compared to the input voltage, which in turn cannot be simply corrected because of unknown input voltage frequency and phase disturbances. In addition, it must be taken into account that a reference signal of an external signal generator cannot be used to match the input voltage to the reference signal, for example. Instead, the reconstructed output voltage must correspond in frequency, amplitude and phase to the fundamental component of the input voltage, and not to a generated reference signal of an external signal generator.

SUMMARY OF INVENTION

An object of the invention is therefore to reconstruct, from a noise-affected input voltage, a noise-reduced output voltage corresponding in frequency, phase and amplitude to the fundamental component of the input voltage. External signal generators are to be eliminated, while nevertheless providing a circuit design that is as simple as possible.

This object is achieved by the inventive features, the invention relating to methods for reconstructing a noise-reduced voltage signal corresponding in frequency, amplitude and phase to a sinusoidal input voltage subject to frequency, amplitude and/or phase noise. It is provided according to the invention that the input voltage is fed to a first band pass filter with controllable resonant frequency, the output voltage of which represents the noise-reduced voltage signal, wherein, by determining the sampled difference voltage between output voltage and input voltage at the zero crossings from the positive to the negative half cycle of the output voltage, a manipulated variable is determined in each case by means of a first controller which controls the resonant frequency of the first band pass filter such that the difference voltage at the zero crossings disappears. The inventive method here makes use of the property of band pass filters that the output voltage of the band pass filter undergoes a phase shift if the frequency of the input voltage deviates from the resonant frequency of the band pass filter, as will be explained in greater detail below. The resonant frequency of the first band pass filter is initially set such that it corresponds to the frequency of the input voltage. If the input voltage now exhibits a frequency disturbance, e.g. is at variance with the grid frequency provided, so that it no longer corresponds to the resonant frequency of the first band pass filter, the output voltage is phase shifted relative to the input voltage. Said phase shift is used according to the invention to detect the disturbance in the input voltage frequency, namely by determining the now non-zero difference voltage between output voltage and input voltage at the zero crossings from the positive to the negative half cycle of the output voltage. The resonant frequency of the first band pass filter is then controlled according to the invention such that it again corresponds to the frequency of the input voltage, i.e. the difference voltage between output voltage and input voltage at the zero crossings of the output voltage disappears again. The setpoint frequency of the control loop therefore always corresponds to the frequency of the input voltage, and a variation in the frequency of the input voltage is also reflected in the frequency of the output voltage. However, after passing through the band pass filter, the output signal is e.g. stripped of its harmonics, making it possible to reliably determine the zero crossings and frequency which precisely correspond to the zero crossings and frequency of the fundamental component of the input voltage. "Noise-reduced voltage signals" are also referred to in this sense below. However, grid-synchronous operation of a downstream circuit arrangement is possible on the basis of an output signal reconstructed in this way.

According to an advantageous further development of the method according to the invention it can also be provided that the sampled difference voltage between output voltage and input voltage at the zero crossings from the positive to the negative and from the negative to the positive half cycle of the output voltage is determined using a first sample-and-hold circuit whose switching element is briefly actuated by a switching signal at the zero crossings from the positive to the negative and from the negative to the positive half cycle of the output voltage, and to which the output/input difference voltage subjected to a second band pass filter is fed. Sample-and-hold circuits are well known e.g. from phase detectors and consist of a switching element and a capacitor. When the switching element closes, the instantaneous voltage value is stored in the capacitor and, due to an impedance transformer acting as buffer, remains unchanged until the next sampling operation. If the switching element is actuated by a switching signal at the zero crossings from the positive to the negative and from the negative to the positive half cycle of the output voltage, the difference voltage between output voltage and input voltage at the zero crossings of the output voltage is determined. For this purpose the difference voltage between output voltage and input voltage is first subjected to a second band pass filter, as said difference voltage still contains all the disturbances and harmonics of the input voltage. The voltage value thus determined constitutes the manipulated variable for the first controller of the resonant frequency of the first band pass filter.

On the basis of the switching signal at the zero crossings, the polarity of the determined voltage value is determined depending on whether the frequency of the input voltage is higher or lower than the resonant frequency of the first band pass filter.

For the case that the frequency of the input voltage is higher than the resonant frequency of the first band pass filter, and the switching signal is assigned to a zero crossing from the positive to the negative half cycle of the output voltage, a negative voltage value is determined. If the switching signal is assigned to a zero crossing from the negative to the positive half cycle of the output voltage, the voltage value determined is positive.

For the case that the frequency of the input voltage is lower than the resonant frequency of the first band pass filter, the polarity of the voltage value determined is transposed accordingly (cf. FIGS. 3 and 4).

The sign of the manipulated variable at the output of the first controller is matched to the polarity of the voltage value determined.

Because of the following control arrangement, any phase shifts of the output signal of the second band pass filter are insignificant. The resonant frequency of the second band pass filter is therefore selected such that it has a bandwidth suitably selected around the frequency of the input voltage to be reconstructed. However, according to an advantageous embodiment, for the second band pass filter it can also be provided that the resonant frequency of the second band pass filter is controlled by the manipulated variable for the resonant frequency of the first band pass filter. However, since, as mentioned, the phase shift of the output signal of the second band pass filter has no effect on the inventive control arrangement, this is open-loop control and not closed-loop control.

Because of the gain tolerance of the first band pass filter, the reconstructed output voltage of the first band pass filter will generally exhibit a changed amplitude compared to the input voltage. According to a preferred embodiment, it is therefore provided that, by determining the sampled difference voltage between output voltage and input voltage at the peaks of the output voltage, a manipulated variable is determined for a second controller which controls the gain of the first band pass filter such that the difference voltage at the peaks of the output voltage disappears. As a result, it can be achieved that the reconstructed output voltage corresponds in amplitude to the input voltage. To determine the manipulated variable of the second controller it can again be provided that the sampled difference voltage between output voltage and input voltage at the positive or negative peaks of the output voltage is determined by means of a second sample-and-hold circuit whose switching element is actuated by a switching signal at the positive or negative peaks of the output voltage, and to which the output/input difference voltage subjected to a third band pass filter is fed. Because of the following control arrangement, any phase shifts of the output signal of the third band pass filter are again insignificant. The resonant frequency of the third band pass filter can therefore be selected such that it has a bandwidth suitably selected around the frequency of the input voltage to be reconstructed.

The polarity of the voltage value determined depends on the sign of the difference voltage between output and input voltage during the occurrence of the switching signal at the peaks.

For the case that the sign of the difference voltage is positive, the voltage value determined is also positive if the switching signal is assigned to a positive peak of the output signal of the first filter. The voltage value determined is negative, however, if the switching signal is assigned to a negative peak of the output signal of the first filter.

For the case that the sign of the difference voltage is negative, the polarity of the voltage value determined is transposed accordingly (cf. FIGS. 7 and 8).

The sign of the manipulated variable at the output of the first controller is therefore matched to the polarity of the voltage value determined.

In a combined version, it can lastly be provided that the sampled difference voltage between output voltage and input voltage at the zero crossings of the output voltage is determined using a first sample-and-hold circuit whose switching element is actuated by a switching signal at the zero crossings of the output voltage, and to which the output/input voltage difference subjected to a second band pass filter is fed, and the sampled difference voltage between output voltage and input voltage at the peaks of the output voltage being determined using a second sample-and-hold circuit whose switching element is actuated by a switching signal at the peaks of the output voltage, and to which the output/input voltage difference subjected to the second band pass filter is fed.

BRIEF DESCRIPTION OF THE DRAWINGS

The invention will now be explained in greater detail on the basis of preferred embodiments and with reference to the accompanying drawings in which.

DETAILED DESCRIPTION OF INVENTION

Figure 1:
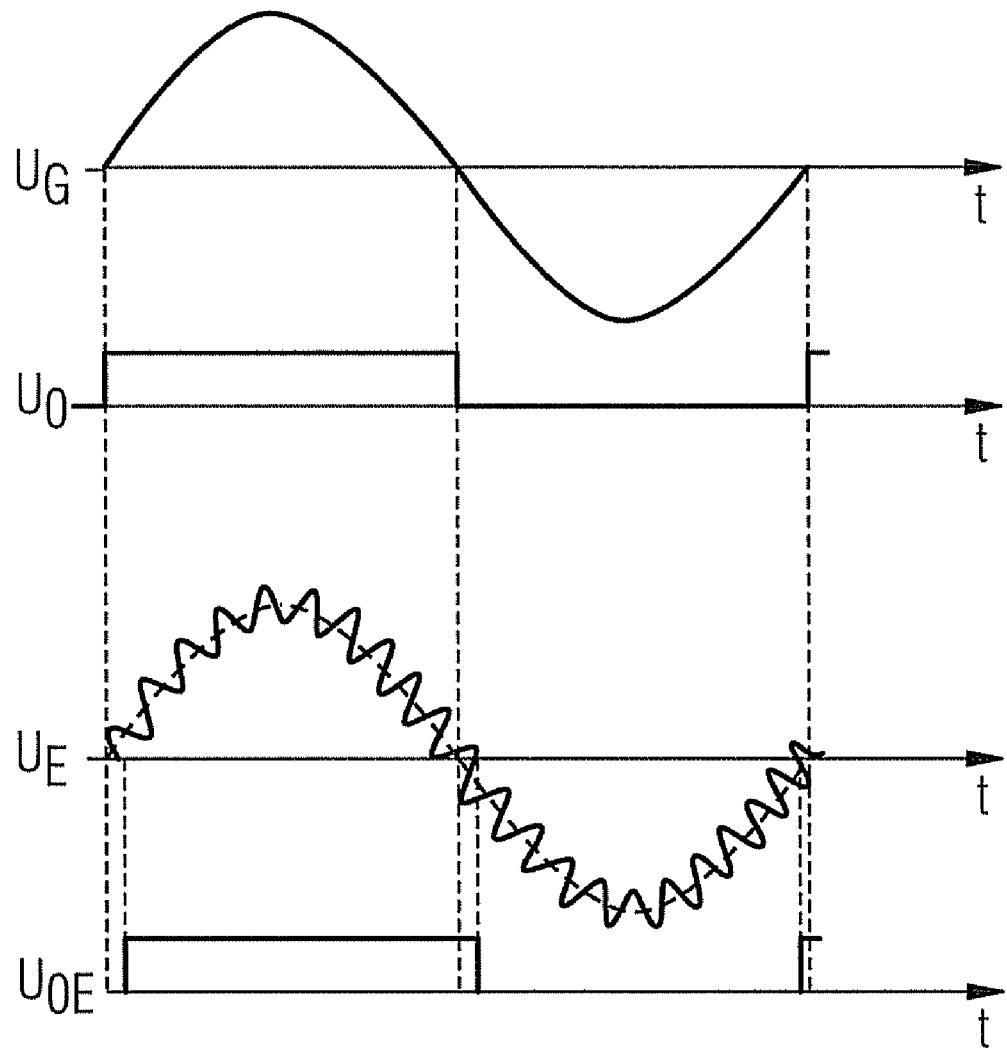
FIG. 1 is a diagram illustrating the problems of erroneous zero crossing detection in the event of a disturbed input voltage.

FIG. 1 first explains the problems of erroneous zero crossing detection in the event of a disturbed input voltage $U_E$, this being e.g. the grid voltage of a power supplier, with which a following circuit arrangement is to be operated in a synchronous manner. A noise-free input voltage first consists solely of a fundamental component $U_G$ (see upper function in FIG. 1) for which there is no problem with zero crossing detection. However, in the case of a noisy input voltage $U_E$, which in the example shown is e.g. overlaid with harmonics, erroneous zero crossing detection may occur, as because of the noise, the zero line is crossed earlier or later compared to the fundamental component $U_G$ (see lower function in FIG. 1). To filter out the high-frequency noise of the input voltage $U_E$, a low pass filter could be used, for example, but this produces a phase shift in the output voltage $U_A$ of the low pass filter compared to the input voltage which, because of unknown frequency and phase disturbances of the input voltage $U_E$, cannot be easily corrected.

Figure 2:
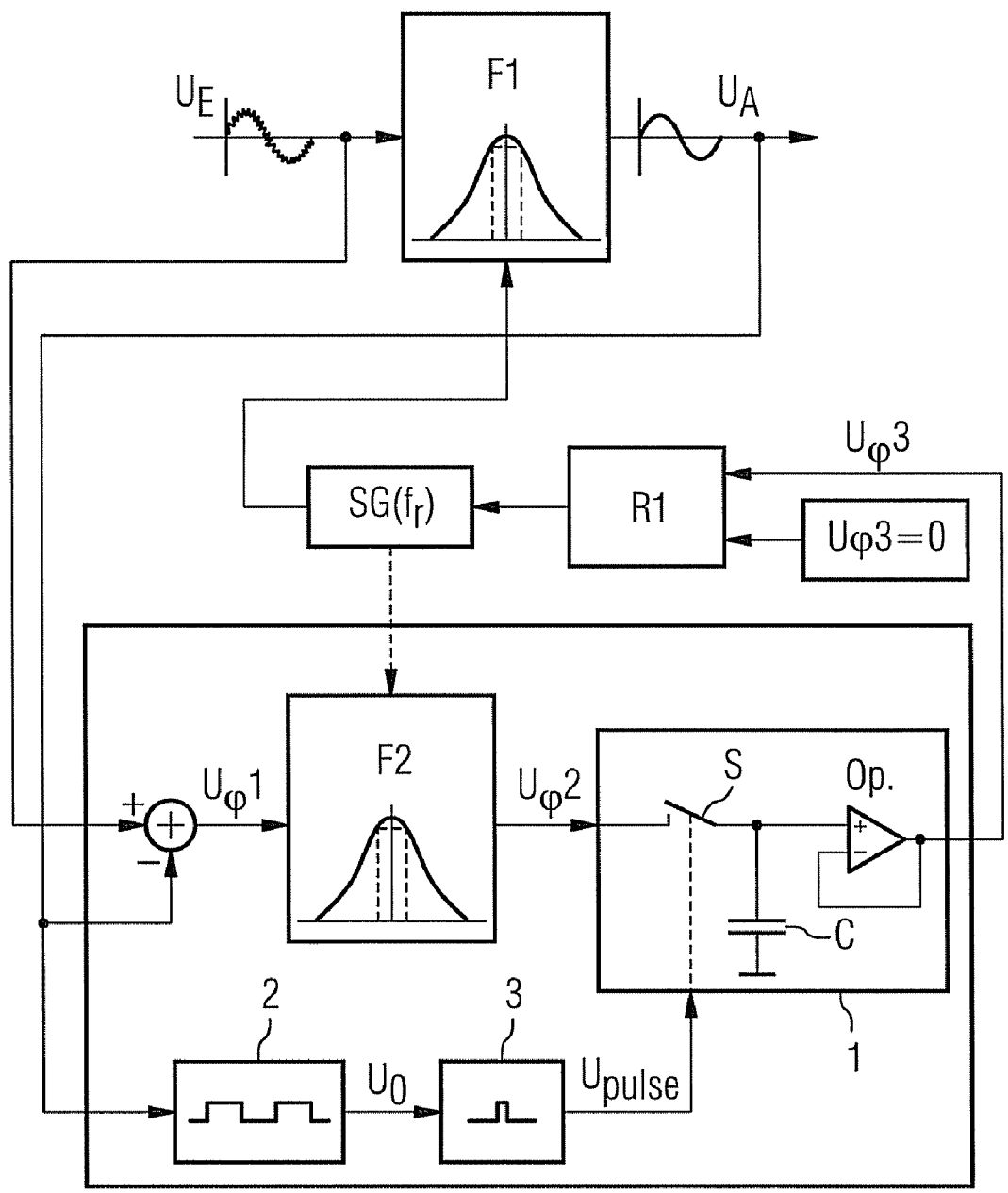
FIG. 2 illustrates the method according to the invention for controlling the resonant frequency of the first band pass filter.

An inventive method is therefore proposed which will be explained with reference to FIG. 2. FIG. 2 firstly shows a first band pass filter F1 to which a noise-affected input voltage $U_E$ is fed. The first band pass filter F1 has a controllable resonant frequency $f_r$, said resonant frequency $f_r$ being controllable in the range 45 to 55 Hz, e.g. for a 50 Hz grid voltage as input voltage $U_E$. Shown at the output of the first band pass filter F1 is the output voltage $U_A$ which, as a result of the effect of the first band pass filter F1, is stripped of high-frequency components and therefore noise-reduced.

As already mentioned, the method according to the invention now makes use of the property of band pass filters that, if the frequency of the input voltage $U_E$ deviates from the resonant frequency $f_r$ of the first band pass filter F1, the output voltage $U_A$ of the first band pass filter F1 undergoes a phase shift which can be expressed as follows:

$$\phi = \arctan[Q^*(1-\Omega^2)/\Omega],$$

where $\phi$ is the phase shift, Q the quality factor of the first band pass filter F1, and $\Omega$ the ratio of the frequency of the input voltage $U_E$ to the resonant frequency $f_r$ of the first band pass filter F1.

The resonant frequency $f_r$ of the first band pass filter F1 is first set such that it corresponds to the frequency of the input voltage $U_E$. If the input voltage $U_E$ now exhibits a frequency disturbance (e.g. deviates from the grid frequency) so that it no longer corresponds to the resonant frequency $f_r$ of the first band pass filter F1, a phase shift in the output voltage $U_A$ compared to the input voltage $U_E$ occurs. Said phase shift $\phi$ is used according to the invention to detect the disturbance in the frequency of the input voltage $U_E$, namely by determining the sampled difference voltage $U_\phi 3$ between output voltage $U_A$ and input voltage $U_E$ at the zero crossings of the output voltage $U_A$, said difference voltage now being non-zero. For this purpose, the difference voltage $U_\phi 1$ between the output voltage $U_A$ and input voltage $U_E$ is first determined.

The sampled difference voltage $U_\phi 3$ between output voltage $U_A$ and input voltage $U_E$ at the zero crossings of the output voltage $U_A$ is determined e.g. by means of a first sample-and-hold circuit 1 whose switching element S is actuated by a switching signal $U_{Pulse}$ at the zero crossings of the output voltage $U_A$, and to which the difference voltage $U_\phi 2$ between output voltage $U_A$ and input voltage $U_E$ subjected to a second band pass filter F2 is fed.

Sample-and-hold circuits 1 are well known e.g. from phase detectors, and consist of a switching element S and a capacitor C. They additionally have an impedance transformer Op implemented as a buffer as shown in FIG. 2. When the switching element S closes, the instantaneous voltage value of the difference voltage $U_\phi 2$ subjected to the second band pass filter F2 is stored in the capacitor C and remains unchanged until the next switching operation due to the impedance transformer Op implemented as a buffer.

To actuate the switching element S, a switching signal $U_{Pulse}$ is required which can be determined e.g. by means of a zero crossing detector 2 and a mono-flip-flop 3 which supplies e.g. pulses with a duration that is dependent on the capacitor C and the type of sample-and-hold circuit 1.

As the switching element S is actuated by the switching signal $U_{Pulse}$ at the zero crossings of the output voltage $U_A$, the sampled difference voltage $U_\phi 3$ between output voltage $U_A$ and input voltage $U_E$ at the zero crossings of the output voltage $U_A$ is determined. The thus determined voltage value is used to determine the manipulated variable $SG(f_r)$ for the first controller R1 of the resonant frequency $f_r$ of the first band pass filter F1 by comparing this value with the setpoint value $U_\phi 3 = 0$.

The resonant frequency $f_r 2$ of the second band pass filter F2 is selected such that it has a bandwidth B suitably selected around the frequency of the input voltage $U_E$ to be reconstructed, i.e. a bandwidth of 10 Hz, for example, at a resonant frequency of 50 Hz in the case of a grid voltage as input voltage $U_E$. However, according to an advantageous embodiment it can also be provided for the second band pass filter F2 that the resonant frequency $f_r 2$ of the second band pass filter F2 is controlled by the manipulated variable $SG(f_r)$ for the resonant frequency $f_r$ of the first band pass filter F1. However, since, as mentioned, the phase shift of the output signal $U_\phi 2$ of the second band pass filter F2 has no effect on the control arrangement according to the invention, any phase shifts of the output signal $U_\phi 2$ of the second band pass filter F2 are insignificant.

The resonant frequency $f_r$ of the first band pass filter F1 is then controlled according to the invention such that it again corresponds to the frequency of the input voltage $U_E$, i.e. the sampled difference voltage $U_\phi 3$ between output voltage $U_A$ and input voltage $U_E$ at the zero crossings of the output voltage $U_A$ disappears again.

Figure 3:
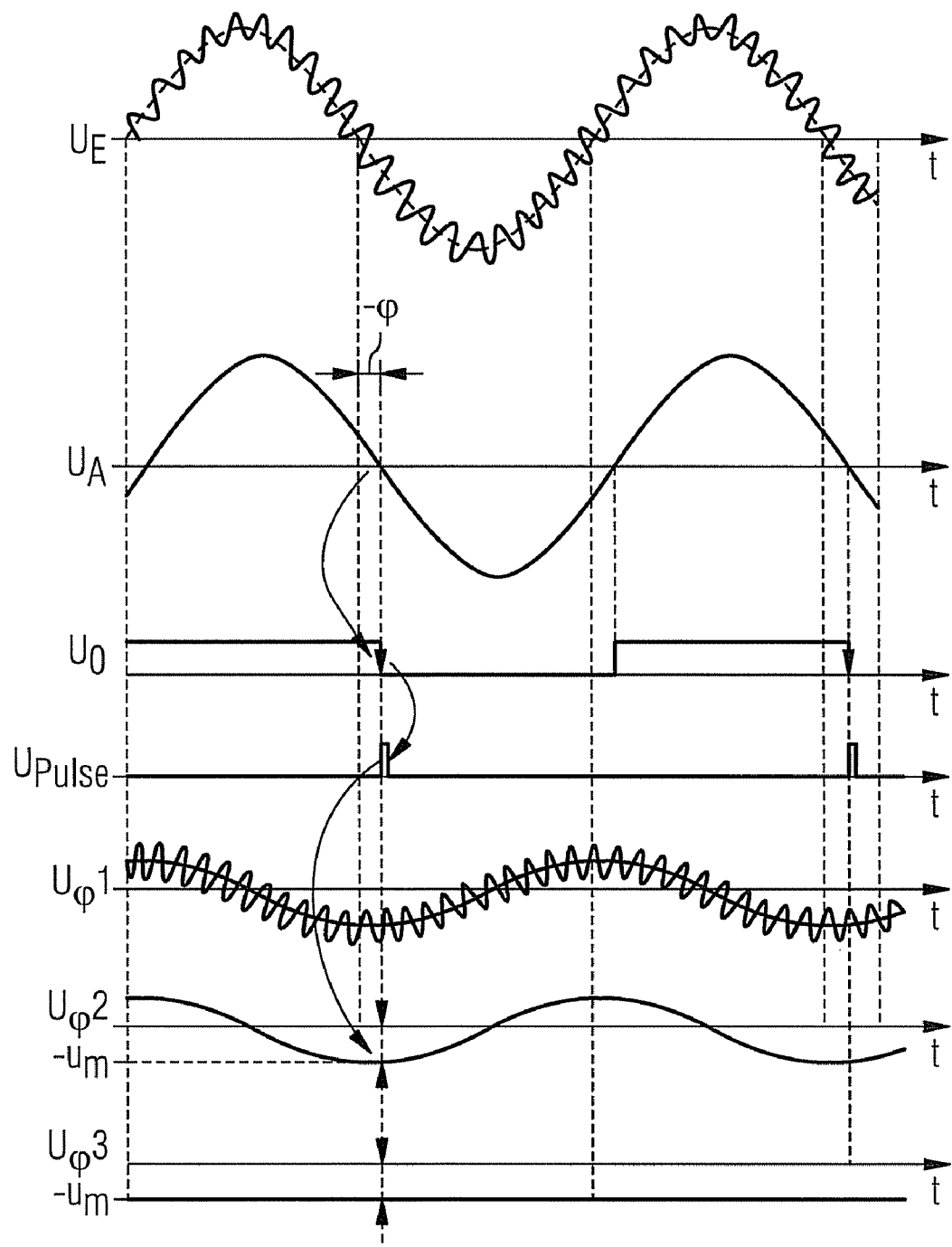
FIG. 3 shows the signal waveforms in the method according to the invention when the frequency of the input voltage is higher than the resonant frequency of the first band pass filter.

FIG. 3 shows the signal waveforms for the input voltage $U_E$, the output voltage $U_A$ after the first band pass filter F1, the signal $U_O$ after the zero crossing detector 2, the switching signal $U_{Pulse}$ after the mono-flip-flop 3, the difference voltage $U_\phi 1$ between output voltage $U_A$ and input voltage $U_E$, the difference voltage $U_\phi 2$ subjected to the second band pass filter F2, and the sampled difference voltage $U_\phi 3$ between output voltage $U_A$ and input voltage $U_E$ at the zero crossings of the output voltage $U_A$, namely for the case in which the frequency of the input voltage $U_E$ is higher than the resonant frequency $f_r$ of the first band pass filter F1. The output voltage $U_A$ after the first band pass filter F1 initially exhibits a phase shift $\phi$. As may also be seen from FIG. 2, the zero crossing detector 2 is fed the output voltage $U_A$ so that the zero crossings of the output voltage $U_A$ do not yet correspond to those of the input voltage $U_E$. The switching signal $U_{Pulse}$ is determined on the basis of the zero crossings of the output voltage $U_A$. It can also be seen that the difference voltage $U_\phi 1$ between output voltage $U_A$ and input voltage $U_E$ still contains all the noise or more specifically harmonics of the input voltage $U_E$, the high-frequency noise being removed after passage through the second band pass filter F2, and the difference voltage $U_\phi 2$ subjected to the second band pass filter F2 being produced. By means of the sample-and-hold circuit 1, the difference voltage $U_\phi 3$ between output voltage $U_A$ and input voltage $U_E$ at the zero crossings from the positive to the negative half cycle of the output voltage $U_A$ is determined, which is shown as $-U_m$ in FIG. 3. The thus determined voltage value $-U_m$ is subsequently used to determine the manipulated variable $SG(f_r)$ for the first controller R1 of the resonant frequency $f_r$ of the first band pass filter F1 by comparing it with the setpoint value $U_\phi 3=0$.

Figure 4:
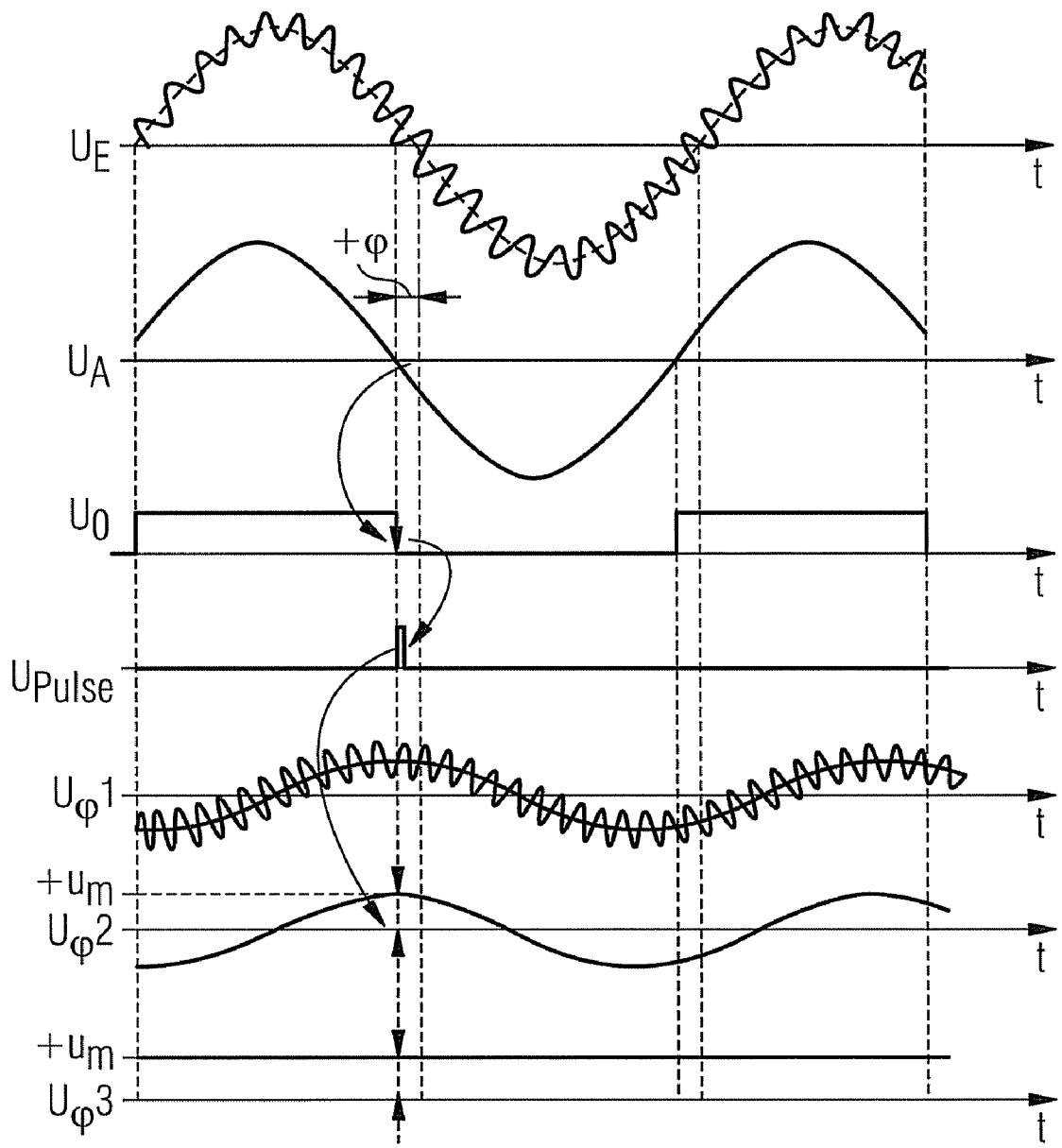
FIG. 4 shows the signal waveforms in the method according to the invention when the frequency of the input voltage is lower than the resonant frequency of the first band pass filter.
Figure 5:
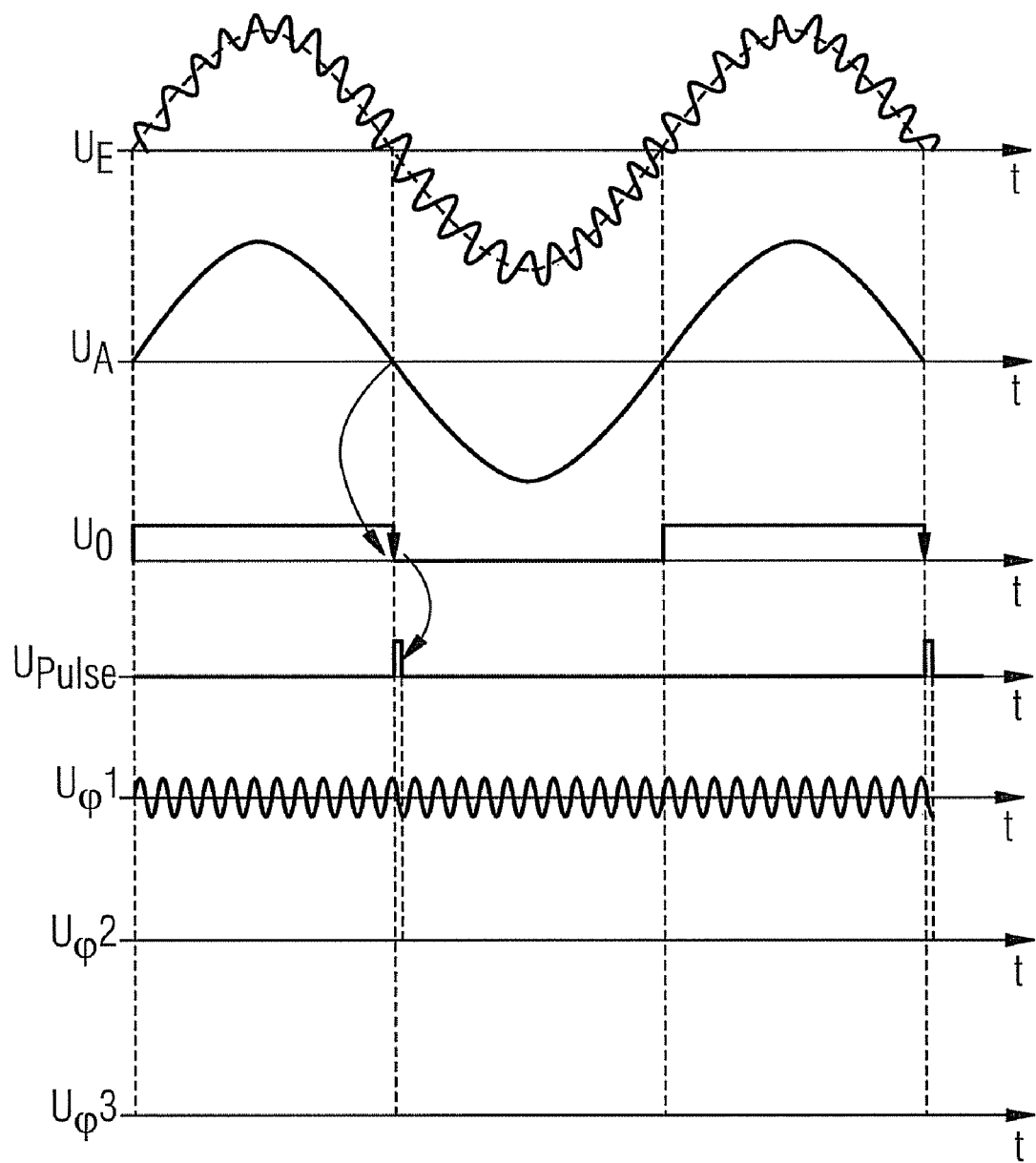
FIG. 5 shows the signal waveforms in the method according to the invention when the frequency of the input voltage corresponds to the resonant frequency of the first band pass filter.

FIG. 4 shows a similar (to FIG. 3) representation of the signal waveforms in the method according to the invention when the frequency of the input voltage $U_E$ is lower than the resonant frequency $f_r$ of the first band pass filter F1. Here the value $+U_m$ (cf. FIG. 4) of the difference voltage $U_\phi 3$ between output voltage $U_A$ and input voltage $U_E$ at the zero crossings from the positive to the negative half cycle of the output voltage $U_A$ is determined by the sample-and-hold circuit 1. FIG. 5 shows the case that the frequency of the input voltage $U_E$ corresponds to the resonant frequency $f_r$ of the first band pass filter F1. In the latter case it may be seen that the difference voltage $U_\phi 3$ between output voltage $U_A$ and input voltage $U_E$ at the zero crossings of the output voltage $U_A$ disappears, and therefore also no manipulated variable $SG(f_r)$ is determined for the first controller R1 of the resonant frequency $f_r$ of the first band pass filter F1. As already mentioned, the sampling process is carried out at the zero crossings from the negative to the positive half cycle of the output voltage $U_A$. It must be taken into account here that the sign of the manipulated variable at the output of the first controller is matched to the polarity of the voltage value $U_\phi 3$ determined.

Figure 6:
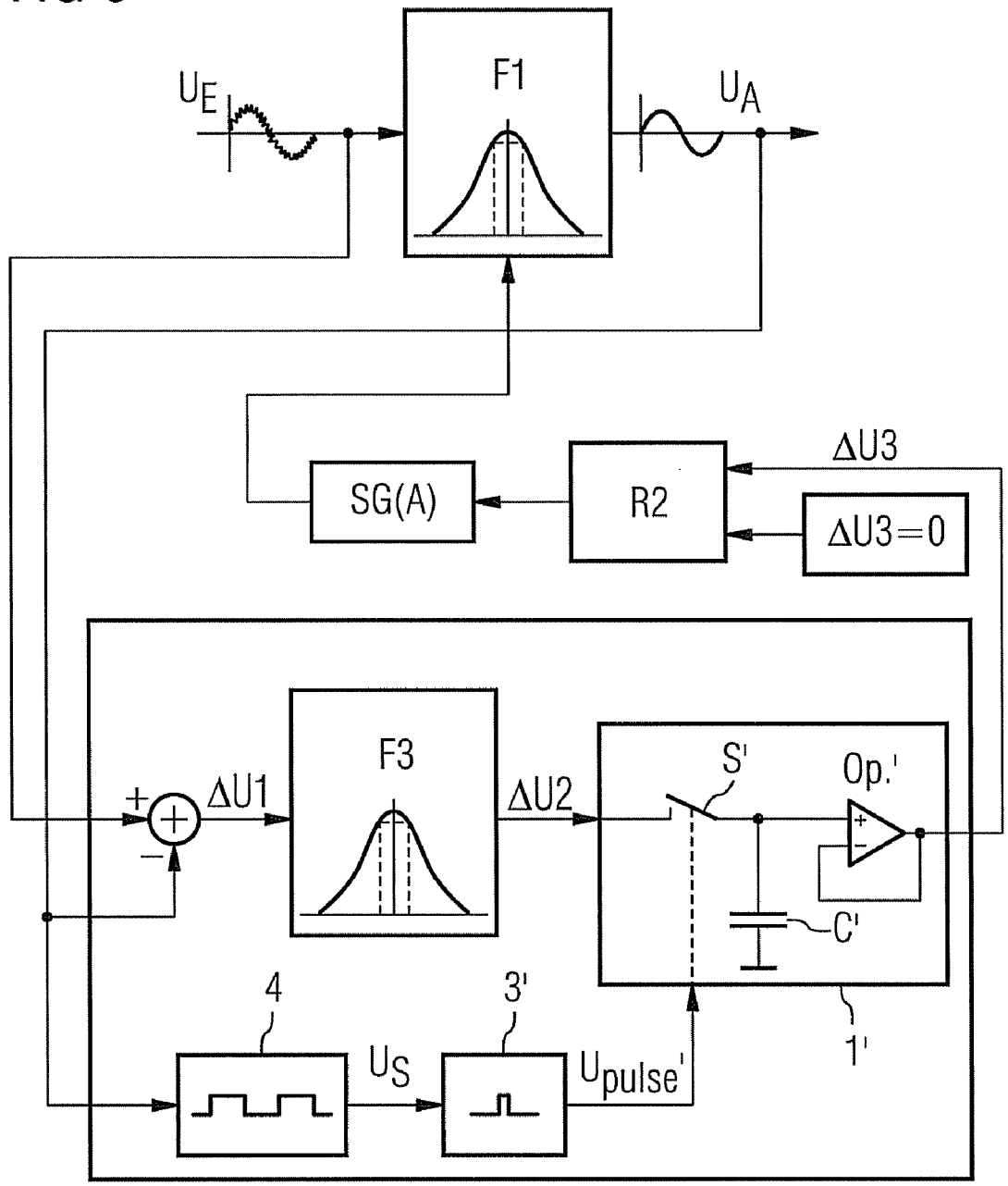
FIG. 6 shows a further development of the method according to the invention for controlling the amplitude of the reconstructed output voltage by means of the first band pass filter.

FIG. 6 lastly shows a further development of the method according to the invention for controlling the amplitude of the reconstructed output voltage $U_A$ for compensating the amplifier tolerance of the first band pass filter. As has been already mentioned, the reconstructed output voltage $U_A$ of the first band pass filter F1 will generally have a changed amplitude compared to the input voltage $U_E$. It is therefore provided according to a preferred embodiment that by determining the sampled difference voltage $\Delta U3$ between output voltage $U_A$ and input voltage $U_E$ at the positive peaks of the output voltage $U_A$, a manipulated variable $SG(A)$ is determined by means of a second controller R2 which controls the gain of the first band pass filter F1 such that the sampled difference voltage $\Delta U3$ at the positive peaks of the output voltage $U_A$ disappears. By this means it can be achieved that the reconstructed output voltage $U_A$ corresponds in amplitude to the input voltage $U_E$. For this purpose, the difference voltage $\Delta U1$ between output voltage $U_A$ and input voltage $U_E$ is first determined.

The sampled difference voltage $\Delta U3$ between output voltage $U_A$ and input voltage $U_E$ at the positive peaks of the output voltage $U_A$ is determined e.g. with the aid of a second sample-and-hold circuit 1' whose switching element S is actuated by a switching signal $U_{Pulse}'$ at the peaks of the output voltage $U_A$, and to which the difference voltage $\Delta U2$ between output voltage $U_A$ and input voltage $U_E$ subjected to a third band pass filter F3 is fed.

To actuate the switching element S', a switching signal $U_{Pulse}'$ is required which can be determined e.g. with the aid of a peak detector 4 and a mono-flip-flop 3' which e.g. supplies pulses with a duration dependent on the capacitor C' and the type of sample-and-hold circuit 1'. As the switching element S' is actuated by the switching signal $U_{Pulse}'$ at the positive peaks of the output voltage $U_A$, the difference voltage $\Delta U3$ between output voltage $U_A$ and input voltage $U_E$ at the positive peaks of the output voltage $U_A$ is determined. The voltage value thus determined is used to determine the manipulated variable $SG(A)$ with the aid of the second controller R2 for the gain of the first band pass filter F1 by comparing it with the setpoint value $\Delta U3=0$.

The resonant frequency $f_{r3}$ of the third band pass filter F3 is in turn selected such that it has a bandwidth B suitably selected around the frequency of the input voltage $U_E$ to be reconstructed, i.e. a bandwidth of 10 Hz, for example, at a resonant frequency of 50 Hz in the case of a grid voltage as input voltage $U_E$.

Figure 7:
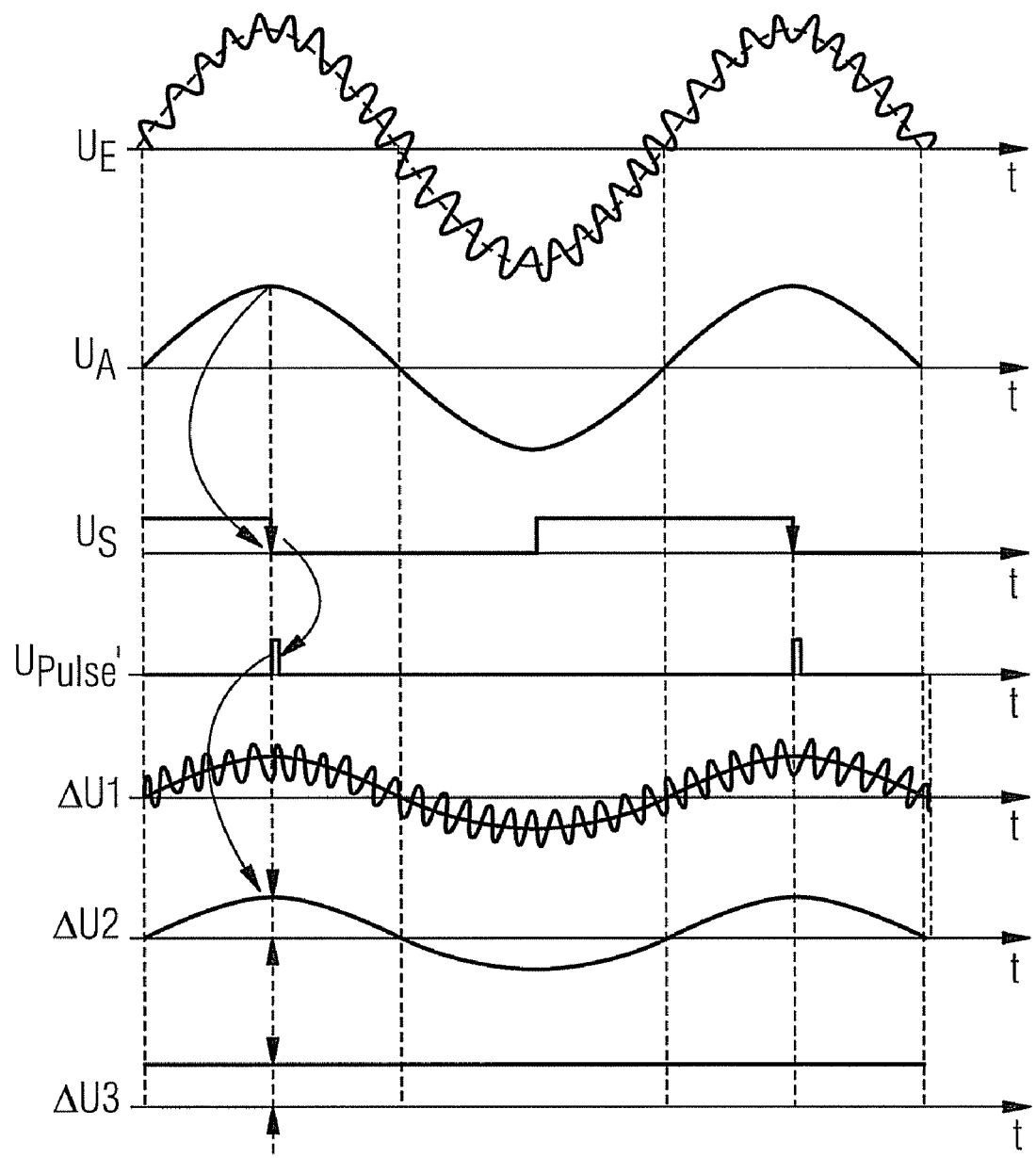
FIG. 7 shows the signal waveforms for the further development of the method according to the invention as shown in FIG. 6 when the amplitude of input voltage is greater than the amplitude of the output voltage.

FIG. 7 shows the signal waveforms of the further development of the method according to the invention as shown in FIG. 6 when the amplitude of the input voltage $U_E$ is higher than the amplitude of the output voltage $U_A$. These signal waveforms are as follows:

the input voltage $U_E$,
the output voltage $U_A$ after the first band pass filter F1,
the signal $U_S$ after the peak detector 4,
the switching signal $U_{Pulse}'$ after the mono-flip-flop 3',
the difference voltage $\Delta U1$ between output voltage $U_A$ and input voltage $U_E$,
the difference voltage $\Delta U2$ subjected to the second band pass filter F2, and
the sampled difference voltage $\Delta U3$ between output voltage $U_A$ and input voltage $U_E$ at the positive peaks of the output voltage $U_A$.

The output voltage $U_A$ after the first band pass filter F1 initially has a different amplitude from that of the input voltage $U_E$. As can also be seen from FIG. 6, the peak detector 4 is fed the output voltage $U_A$, the peak values of the output voltage $U_A$ not yet corresponding to those of the input voltage $U_E$. The switching signal $U_{Pulse}'$ is determined on the basis of the position of the positive peaks in the output voltage $U_A$. It can also be seen that the difference voltage $\Delta U1$ between output voltage $U_A$ and input voltage $U_E$ still contains all the noise or more specifically harmonics of the input voltage $U_E$, the high-frequency noise being removed after passage through the third band pass filter F3, and the difference voltage $\Delta U2$ subjected to the third band pass filter F3 being produced. By means of the sample-and-hold circuit 1', the difference voltage $\Delta U3$ between output voltage $U_A$ and input voltage $U_E$ at the positive peaks of the output voltage $U_A$ is determined. The sampled voltage value $\Delta U3$ is subsequently used to determine the manipulated variable $SG(A)$ for the second controller R2 for the gain of the first band pass filter F1 by comparing it with the setpoint value $\Delta U3=0$.

Figure 8:
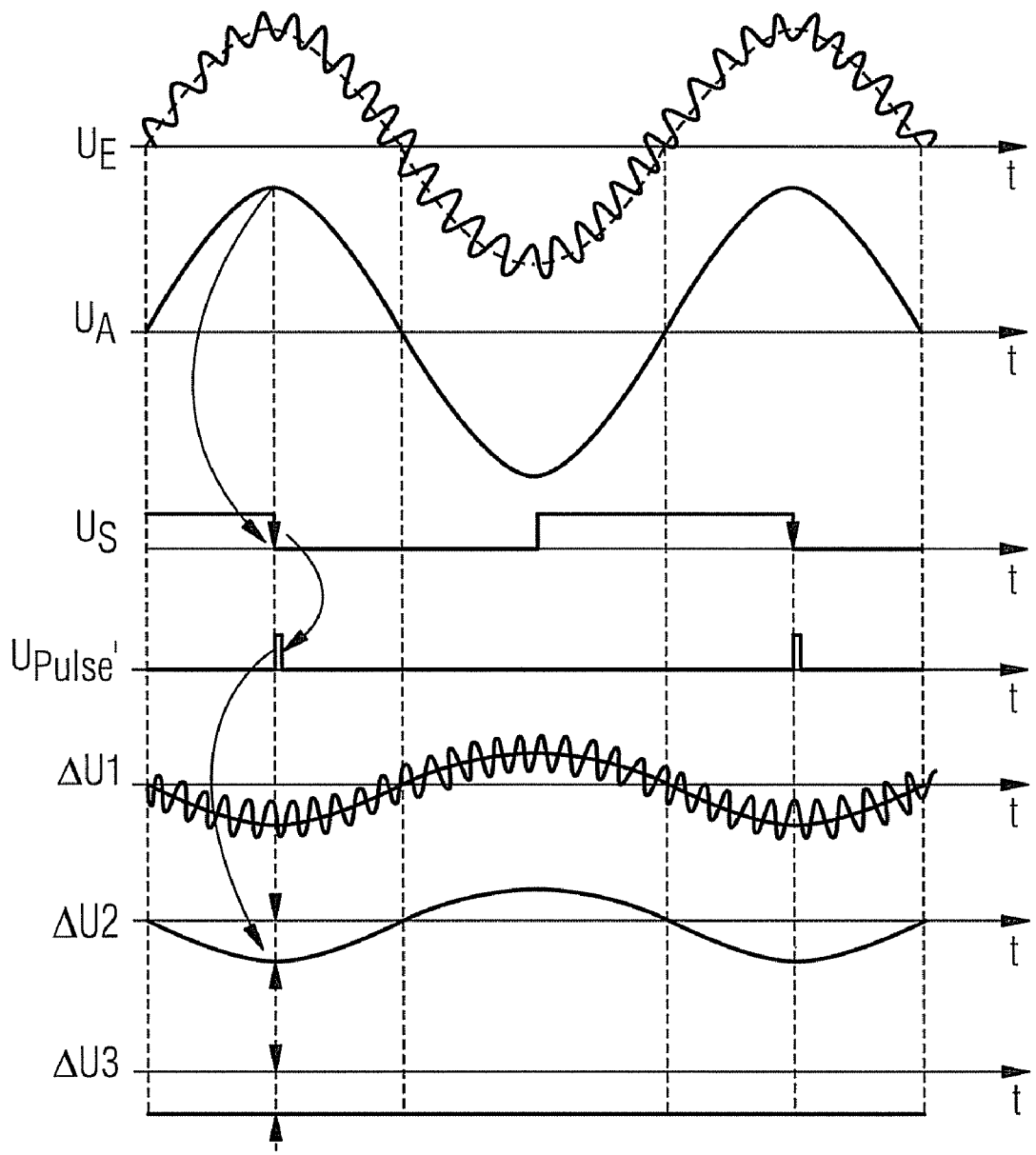
FIG. 8 shows the signal waveforms for the further development of the method according to the invention as shown in FIG. 6 when the amplitude of the input voltage is less than the amplitude of the output voltage.

FIG. 8 finally shows the signal waveforms for the further development of the method according to the invention as shown in FIG. 6 when the amplitude of the input voltage $U_E$ is less than the amplitude of the output voltage $U_A$.

As already mentioned, the sampling process can also be carried out at the negative peaks of the output voltage $U_A$. It must be taken into account here that the sign of the manipulated variable at the output of the second controller must be matched to the polarity of the voltage value $\Delta U3$ determined.

Figure 9:
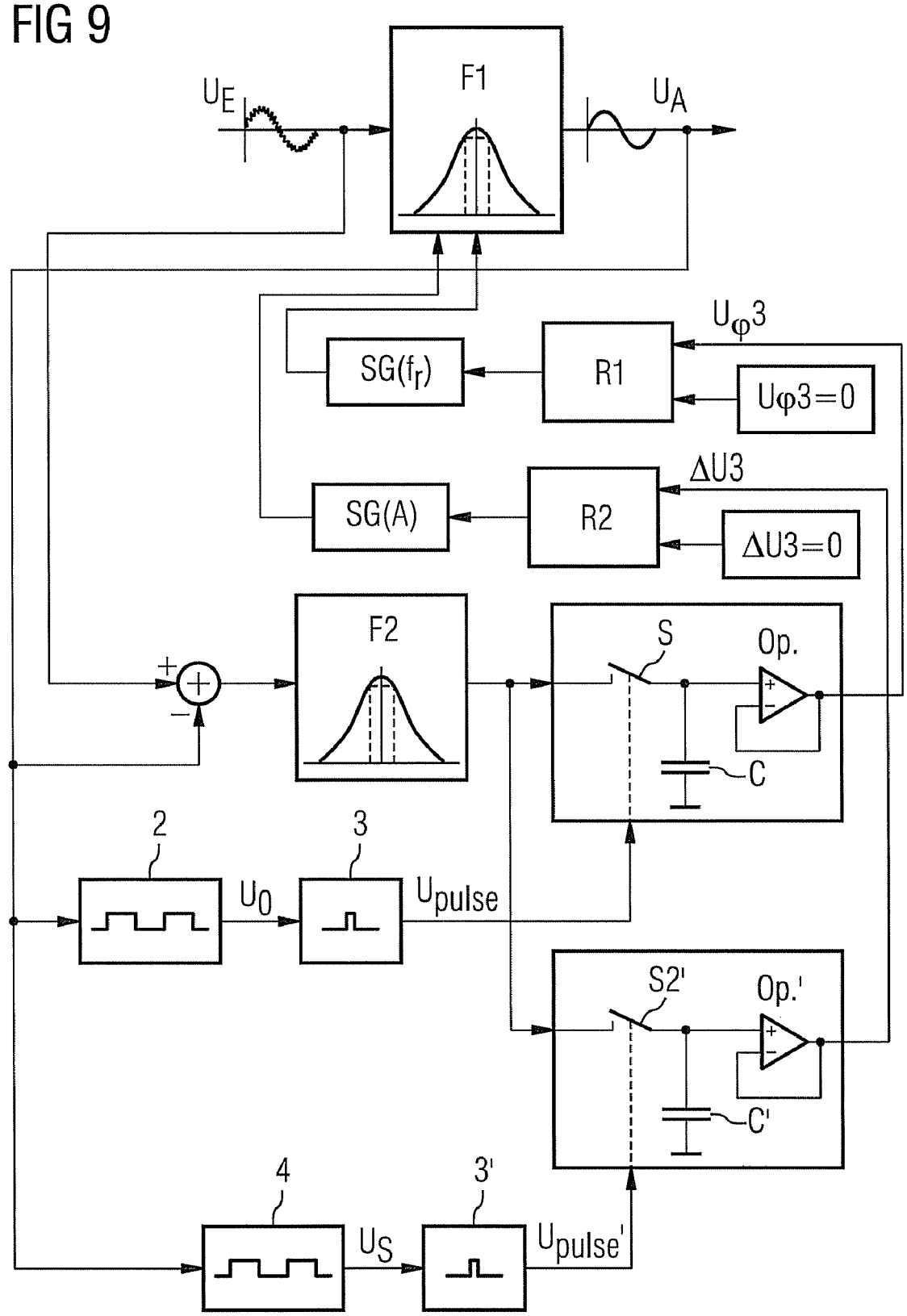
FIG. 9 shows a further development of the method according to the invention for simultaneously controlling the resonant frequency and the amplitude of the reconstructed output voltage by means of a first band pass filter and a second band pass filter.

FIG. 9 shows a further development of the method according to the invention for controlling the resonant frequency $f_r$ of the first band pass filter. Here a second band pass filter F2 is provided which is connected both to a first sample-and-hold circuit 1 and to a second sample-and-hold circuit 1'. The first sample-and-hold circuit 1 supplies the difference voltage $U_\phi 3$ between output voltage $U_A$ and input voltage $U_E$ at the zero crossing, to the first controller R1. The second sample-and-hold circuit 1' supplies the difference voltage $\Delta U3$ between output voltage $U_A$ and input voltage $U_E$ at the peak, to a second controller R2.

By means of the method according to the invention, from a noise-affected input voltage $U_E$, a noise-reduced output voltage $U_A$ corresponding in frequency, phase and amplitude to the fundamental component $U_G$ of the input voltage $U_E$ is therefore reconstructed. Although external signal generators are eliminated, an extremely simple circuit design is nevertheless achieved.

The invention claimed is:

1. A method of reconstructing a noise-reduced voltage signal corresponding in frequency, amplitude and phase to a sinusoidal input voltage affected by frequency, amplitude and/or phase noise, comprising:
    feeding the sinusoidal input voltage to a first band pass filter with controllable resonant frequency, the output voltage of the first band pass filter representing the noise-reduced voltage signal;
    determining a sampled difference voltage between the output voltage and the sinusoidal input voltage at zero crossings of the output voltage; and
    determining a manipulated variable for a first controller which controls a resonant frequency of the first band pass filter such that the sampled difference voltage at the zero crossings disappears.

2. The method as claimed in claim 1,
    wherein the sampled difference voltage between the output voltage and the sinusoidal input voltage at the zero crossings of the output voltage is determined by a first sample-and-hold circuit, the first sample-and-hold circuit including a switching element which is actuated by a switching signal at the zero crossings of the output voltage, and
    wherein a difference voltage between the output voltage and the sinusoidal input voltage subjected to a second band pass filter is fed to the switching element.

3. The method as claimed in claim 2, wherein a resonant frequency of the second band pass filter is controlled by the manipulated variable for the resonant frequency of the first band pass filter.

4. The method as claimed in claim 1, further comprising:
    determining the sampled difference voltage between the output voltage and the sinusoidal input voltage at peaks of the output voltage; and
    determining a manipulated variable for a second controller which controls the gain of the first band pass filter such that the sampled difference voltage at the peaks of the output voltage disappears.

5. The method as claimed in claim 4,
    wherein the sampled difference voltage between the output voltage and the sinusoidal input voltage at the peaks of the output voltage is determined by a second sample-and-hold circuit, the second sample-and-hold circuit including a switching element which is actuated by a switching signal at the peaks of the output voltage, and
    wherein a difference voltage between the output voltage and the sinusoidal input voltage subjected to a third band pass filter is fed to the switching element.

6. The method as claimed in claim 1,
    wherein the sampled difference voltage between the output voltage and the sinusoidal input voltage at the zero crossings of the output voltage is determined by a first sample-and-hold circuit, the first sample-and-hold circuit including a switching element which is actuated by a switching signal at the zero crossings of the output voltage,
    wherein a difference voltage between the output voltage and the sinusoidal input voltage subjected to a second band pass filter is fed to the switching element,
    wherein the sampled difference voltage between the output voltage and the sinusoidal input voltage at peaks of the output voltage is determined by a second sample-and-hold circuit, the second sample-and-hold circuit including a switching element which is actuated by a switching signal at the peaks of the output voltage, and
    wherein the difference voltage between output voltage and the sinusoidal input voltage subjected to a second band pass filter is fed to the switching element.

* * * * *